(12) United States Patent
Sliech et al.

(10) Patent No.: US 9,627,864 B2
(45) Date of Patent: Apr. 18, 2017

(54) DETACHABLE INTERFACE FOR HIGH POWERED ELECTRONIC MODULES

(71) Applicant: BAE Systems Information and Electronic Systems Integration Inc., Nashua, NH (US)

(72) Inventors: Kevin W. Sliech, Merrimack, NH (US); Timothy M. Dresser, Nashua, NH (US); Jared P. Majcher, Manchester, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 120 days.

(21) Appl. No.: 14/429,114

(22) PCT Filed: Jul. 14, 2014

(86) PCT No.: PCT/US2014/046453
§ 371 (c)(1),
(2) Date: Mar. 18, 2015

(87) PCT Pub. No.: WO2015/009582
PCT Pub. Date: Jan. 22, 2015

(65) Prior Publication Data
US 2015/0223365 A1 Aug. 6, 2015

Related U.S. Application Data

(60) Provisional application No. 61/847,678, filed on Jul. 18, 2013, provisional application No. 61/847,677, (Continued)

(51) Int. Cl.
*H05K 7/20* (2006.01)
*H01L 23/473* (2006.01)
(Continued)

(52) U.S. Cl.
CPC .......... *H02B 1/56* (2013.01); *H01Q 21/0087* (2013.01); *H01R 4/48* (2013.01); *H01R 12/52* (2013.01); *H02B 1/20* (2013.01); *H05K 7/209* (2013.01); *H05K 7/20254* (2013.01); *H05K 7/20927* (2013.01); *H01L 23/473* (2013.01); *H05K 7/20218* (2013.01)

(58) Field of Classification Search
CPC ............ H05K 1/0272; H05K 7/2089–7/20945
See application file for complete search history.

(56) References Cited

U.S. PATENT DOCUMENTS 4,718,163 A * 1/1988 Berland ............... H05K 1/0272
174/16.3
6,347,043 B1  2/2002 Natarajan et al.
(Continued)

OTHER PUBLICATIONS

PCT/US14/46453, ISR mailed on Nov. 25, 2014.

*Primary Examiner* — Robert J Hoffberg
(74) *Attorney, Agent, or Firm* — Scott J. Asmus; Global IP Services

(57) ABSTRACT

A detachable high powered electronic module of a high powered electronic system capable of receiving high power is disclosed. In one embodiment, the detachable high powered electronic includes a sub-array of the high powered electronic module, a heat exchanger assembly, a power converter module, and a mechanical interface. The mechanical interface is configured to detachably couple the sub-array and the power converter module via the heat exchanger assembly. Further, the detachable sub-array assembly is configured to deliver power received from the power converter module to the sub-array and also to substantially simultaneously extract heat away from the detachable sub-array.

15 Claims, 3 Drawing Sheets

Related U.S. Application Data filed on Jul. 18, 2013, provisional application No. 61/847,682, filed on Jul. 18, 2013.

(51) Int. Cl.
  *H02B 1/56* (2006.01)
  *H01R 4/48* (2006.01)
  *H01R 12/52* (2011.01)
  *H01Q 21/00* (2006.01)
  *H02B 1/20* (2006.01)

(56) References Cited

U.S. PATENT DOCUMENTS

| | | | |
|---|---|---|---|
| 6,788,537 B2 * | 9/2004 | Saita | F28D 15/0233 |
| | | | 165/104.33 |
| 7,336,490 B2 | 2/2008 | Harris et al. | |
| 7,580,261 B2 * | 8/2009 | Smith | H01L 23/4735 |
| | | | 165/104.33 |
| 7,791,889 B2 * | 9/2010 | Belady | H01L 23/467 |
| | | | 361/694 |
| 8,302,408 B2 * | 11/2012 | Miki | F28F 3/083 |
| | | | 62/3.3 |
| 9,030,822 B2 * | 5/2015 | Sharaf | H05K 7/20927 |
| | | | 165/104.33 |
| 9,472,924 B2 * | 10/2016 | Majcher | H05K 7/20927 |
| 2009/0067122 A1 | 3/2009 | Darr | |
| 2015/0214642 A1 | 7/2015 | Majcher | |
| 2015/0222099 A1 * | 8/2015 | Sliech | H05K 7/20927 |
| | | | 361/677 |

* cited by examiner

DETACHABLE INTERFACE FOR HIGH POWERED ELECTRONIC MODULES

CROSS-REFERENCE TO RELATED APPLICATIONS

This Application claims rights under 35 USC §119(e) from U.S. Application 61/847,678 filed Jul. 18, 2013, the contents of which are incorporated herein by reference.

BACKGROUND OF THE INVENTION

Field of the Invention

The present invention relates to high powered electronic module and more particularly to detachable interface for high powered electronic module.

Brief Description of Related Art

Typically, heat exchangers do not provide direct current (DC) power to high powered electronic modules. Instead additional large connectors are used to provide the DC power to the high powered electronic modules. Generally, electrical connection to other parts or the power electronic system is made by screw contacts, pin contacts (soldered onto a PCB), press-fit contacts pressed into PCB vias, spring contacts that inherently press on contact areas of a PCB and/or by pure pressure contact where corrosion-proof surface areas are directly pressed together. This may result in sacrificing heat exchange area, which in turn may result in increased thermal impedance and thus further resulting in increased temperature of the high powered electronic modules. Conversely, using smaller connectors may result in decreased thermal impedance, but can result in unwanted voltage drop across pins.

For example, a full aperture of a phased array radar system includes a two dimensional grid of rectangular sub-arrays mounted to an assembly that must provide both heat removal and direct current (DC) power. Typically, each of these sub-arrays requires a large amount of DC current, dissipates a large amount of power, and must be mechanically attached in a removable way. In aggregate, the two dimensional grid of rectangular sub-arrays may require over 1000 Amps of power delivered on the positive supply side voltage, with an equal amount of power returning on the Ground path.

Additionally, to achieve a reliable mechanical connection, more thermal area of the sub-array may be sacrificed for incorporating removable attachment mechanisms. Further, typically, thermal, mechanical, and electrical interfaces are not shared. Furthermore, typically, these sub-arrays are bonded to the heat exchanger with an epoxy, making removal of a sub-array disposed in the middle of the sub-arrays very difficult and risky for nearby sub-arrays.

SUMMARY OF THE INVENTION

A detachable interface capable of delivering low voltage and high current for high powered electronic modules is disclosed. According to one aspect of the present subject matter, the system includes a high powered electronic module of a high powered electronic system, a heat exchanger assembly, a power converter module, and a mechanical interface. The mechanical interface is configured to detachably couple the high powered electronic module and the power converter module via the heat exchanger assembly. Further, the detachable high powered electronic module is configured to deliver high or low DC or AC power received from the power converter module to the high powered electronic module and also to substantially simultaneously extract heat away from the detachable high powered electronic module.

According to another aspect of the present subject matter, the system includes a high powered electronic module, a power converter module of a high powered electronic system, and a mechanical interface. The mechanical interface is configured to detachably couple to the high powered electronic module and the power converter module via a heat exchanger assembly. Further, the detachable high powered electronic module is configured to deliver high DC power received from the power converter module to the high powered electronic module and also to substantially simultaneously extract heat away from the detachable high powered electronic module of the high powered electronic assembly.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

DETAILED DESCRIPTION OF THE INVENTION

The exemplary embodiments described herein in detail for illustrative purposes are subject to many variations in structure and design. The present technique provides easily detachable high powered electronic module that is capable of delivering low voltage and high power while minimizing thermal impedance to a high powered electronic assembly. The above technique minimizes the thermal impedance of the thermal interface, while minimizing the impedance of the direct current (DC) connections and allowing for a simple, reliable, and removable mechanical interface/attachment.

Figure 1:
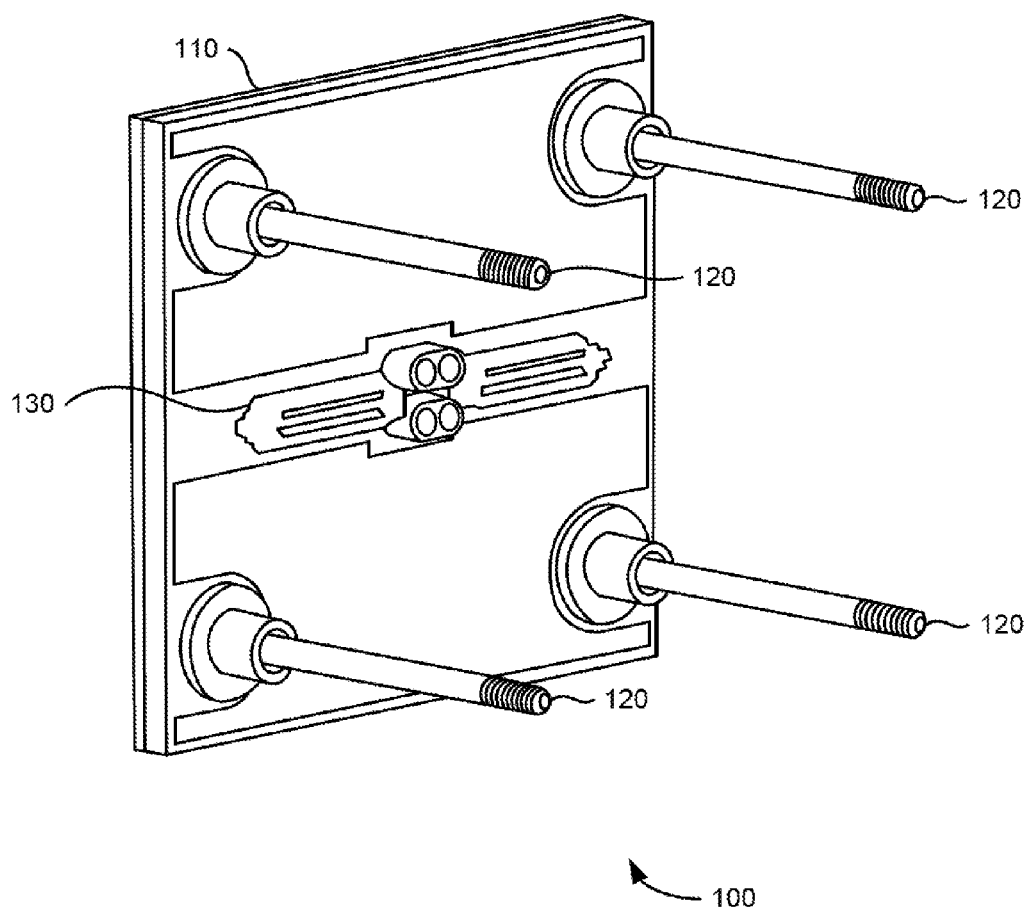
FIG. 1 is a schematic diagram of a perspective view of a detachable high powered electronic module for high powered electronic system including a portion of mechanical coupling that enable easier detachment from the high powered electronic system, according to an example embodiment of the present subject matter.
Figure 2:
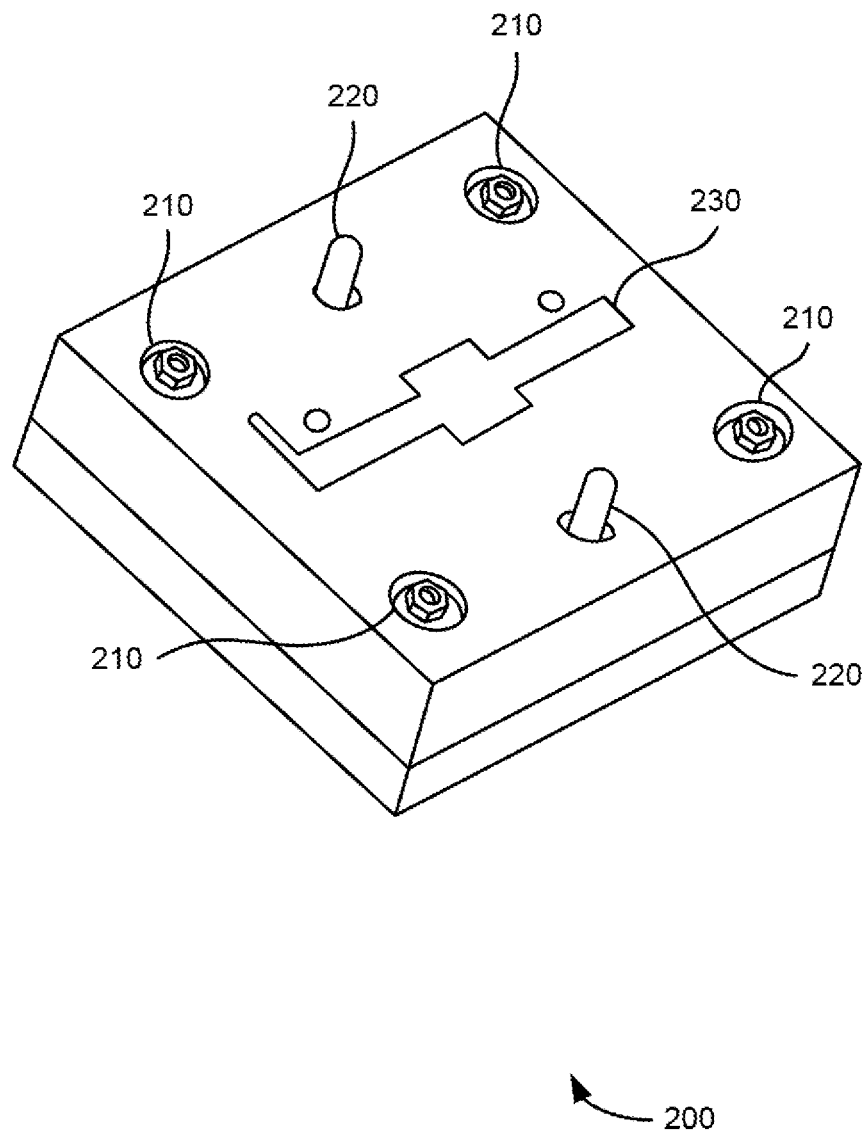
FIG. 2 is a schematic diagram of a bottom perspective view of a power converter module including remaining mechanical coupling components that enable easier detachment from the high powered electronic module of the high powered electronic system, such as those shown in FIG. 1, according to an example embodiment of the present subject matter.

FIG. 1 is a schematic diagram of a perspective view 100 of a detachable high powered electronic module 110 for a high powered electronic system 307 (shown in FIG. 3), according to an example embodiment of the present subject matter. Further, FIG. 2 is a schematic diagram of a bottom perspective view of a power converter module 200 including remaining mechanical coupling components 210 that enable easier detachment of the high powered electronic module 110 from the high powered electronic system 307, such as those shown in FIG. 1, according to an example embodiment of the present subject matter. Also as shown in FIG. 2, the power converter module 200 includes input power lugs 220 configured for receiving high voltage low current from an external supply voltage source. Furthermore, FIG. 3 is an exploded view of the high powered electronic assembly 300 showing the attachment of the one or more detachable high powered electronic modules 110 and the power converter module 200 to a heat exchanger assembly 305, such as those shown in FIGS. 1 and 2, according to an example embodiment of the present subject matter.

As shown in FIG. 1, the detachable high powered electronic module 100 includes a high powered electronic module 110 of the high powered electronic system 307. As shown in FIG. 3, it can be seen that the high powered electronic system 307 can have any number of such detachable high powered electronic module 110 that could be arranged in horizontal and vertical sub-arrays forming a matrix. Further as shown in FIG. 1, the detachable high powered electronic module 110 includes a mechanical interface 120 and a signal connector 130. The signal connector 130 connects the electronic components on the high powered electronic module 110 with external electrical components. In some embodiments, the mechanical interface 120 includes a plurality of conductive fasteners configured to mechanically couple the high powered electronic module 110 and the power converter module 200 (shown in FIG. 2) and deliver the needed high power to the electronic components, such as integrated circuits, on the high powered electronic module 110 via the power converter module 200. Exemplary plurality of conductive fasteners includes a plurality of conductive lugs/screws/posts and associated plurality of nuts 210 (shown in FIG. 2). Furthermore in these embodiments, the plurality of conductive fasteners of the mechanical interface 120 is configured to deliver positive supply voltage and return the negative voltage via a ground i.e., the heat exchanger assembly and/or some of the plurality of conductive lugs of the mechanical interface 120.

Figure 3:
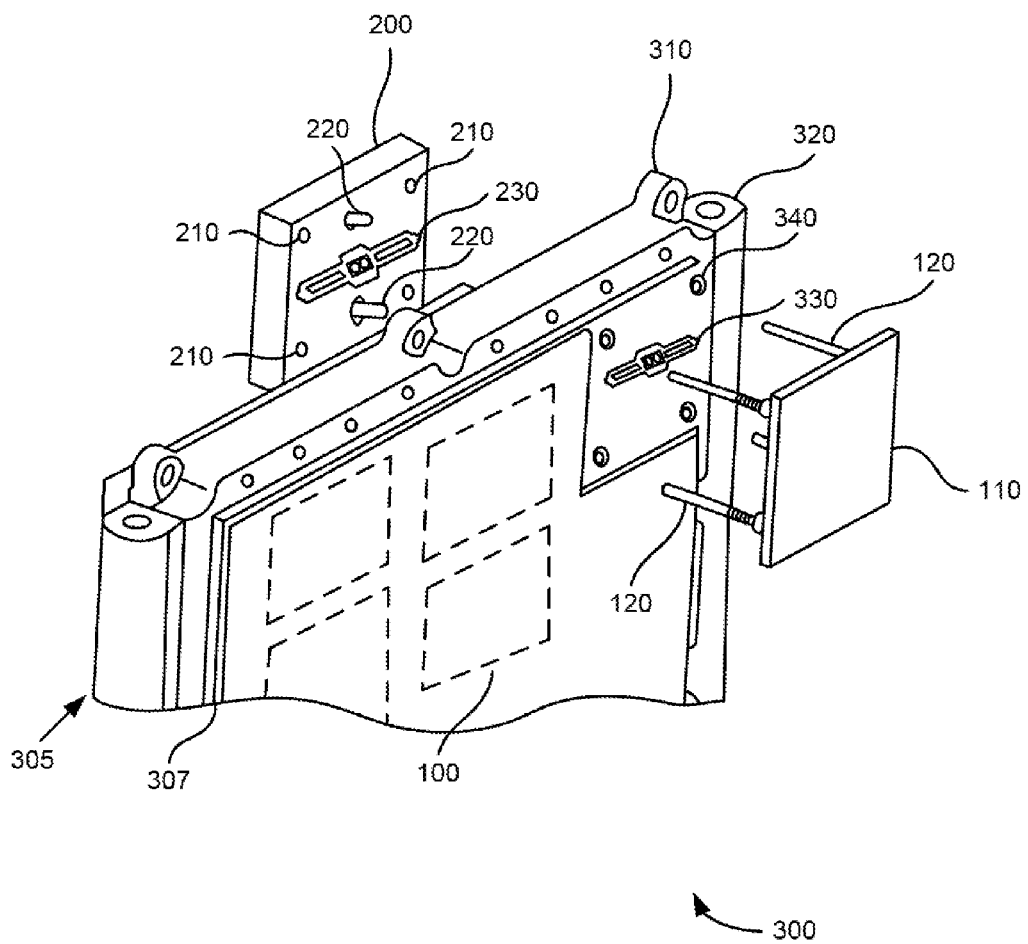
FIG. 3 is an exploded view showing the attachment of the high powered electronic system including at least one detachable high powered electronic module and the power converter module to a heat exchanger assembly, such as those shown in FIGS. 1 and 2, according to an example embodiment of the present subject matter.

As shown in FIG. 2, the remaining mechanical components of the mechanical interface 120 include nuts 210 that are configured to receive positive power supply via the plurality of conductive lugs/fasteners of the mechanical interface 120 (shown in FIG. 1) and the return power via the heat exchanger assembly 305 (shown in FIG. 3). Further as shown in FIG. 2, it can be seen that the power converter module 200 is configured to receive the signal connector 130 shown in FIG. 1. In some embodiments, the power converter module 200 is configured to be a power bus or a power converter. In these embodiments, the power bus or the power converter is capable of delivering needed high power to the mechanical interface 120 shown in FIG. 1. Further in these embodiments, the power is a direct current (DC) power.

FIG. 3 shows detachable high powered electronic assembly including the detachable high powered electronic module 110, the power converter module 200, and a heat exchanger assembly 305. Also as shown in FIG. 3, the heat exchanger assembly 305 includes a heat exchanger 310, and a coolant manifold 320. Further as shown in FIG. 3, heat exchanger 310 and the coolant manifold 320 are configured with connector 330 to receive the signal connector 130 (shown in FIG. 1). In these embodiments, the heat exchanger 310 and the power converter module 200 (shown in FIG. 2) are configured with connector 230 to receive the signal connector 130 (shown in FIG. 1). Furthermore it can be seen in FIG. 3, the heat exchanger assembly 305 is disposed to receive the plurality of lugs from the mechanical interface 120 and allow for the plurality of lugs from the mechanical interface 120 to also contact the power converter module 200 so as to be anchored to the heat exchanger assembly 305 and the power converter module 200, when the plurality of lugs from the mechanical interface 120 are secured with a fastening mechanism such as the plurality of nuts 210. In some embodiments, a conductive interface material, such as indium foil, is configured and disposed between the high powered electronic module 110 and the heat exchanger assembly 305 to allow for the ground and thermal connections that can be compressed by tightening the plurality of lugs from the mechanical interface 120 with the plurality of nuts 210.

In operation, the plurality of conductive lugs from the mechanical interface 120 are configured to receive power (positive supply voltage) from the power converter module 200 via the nuts 210 and deliver it to the electronic components, such as integrated circuits, disposed on the high powered electronic module 110, while providing the needed mechanical coupling between the power converter module 200, the heat exchanger assembly 305 and the high powered electronic module 110. Further in operation, the power converter module 200 is configured to receive the negative voltage via the heat exchanger assembly 305. Moreover in operation, the heat exchanger assembly 305 is configured to remove the heat from the one or more high powered electronic modules 110 disposed on the high powered electronic system 307.

It can be seen in FIG. 3, the detachable high powered electronic module 110 allows for loosening and tightening of the plurality of conductive lugs from the mechanical interface 120 and nuts 210 (shown in FIGS. 1-3), thereby facilitating easier removal of the high powered electronic modules 110 without causing any damage to the neighboring high powered electronic modules 110 disposed on the high powered electronic system 307.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A detachable high powered electronic system, comprising:
   a heat exchanger assembly;
   a high powered electronic module;
   a power converter module; and
   a mechanical interface configured to detachably couple the high powered electronic module and the power converter module via the heat exchanger assembly disposed therebetween and further configured to deliver power received from the power converter module to the high powered electronic module, wherein the mechanical interface comprises a plurality of conductive fasteners configured to detachably couple the high powered electronic module and the power converter module and deliver the power from the power converter module to a plurality of electrical components on the high powered electronic module.

2. The detachable high powered electronic system of claim 1, wherein the power converter module is a power bus or a power converter.

3. The detachable high powered electronic system of claim 2, wherein the power bus is capable of delivering the power from the power bus to the high powered electronic module through the mechanical interface.

4. The detachable high powered electronic system of claim 2, wherein the power converter is configured to receive a high voltage and a low current and deliver a low voltage and a high current from the power converter to the high powered electronic module through the mechanical interface, the high voltage is greater than the low voltage and the low current is less than the high current.

5. The detachable high powered electronic system of claim 1, wherein the power is direct current (DC) power or alternating current (AC) power.

6. The detachable high powered electronic system of claim 1, wherein the high powered electronic module is a plurality of high powered electronic modules and the power converter module is a plurality of power converter modules, the plurality of high powered electronic modules and power converter modules detachably coupled and forming a sub-array.

7. The detachable high powered electronic system of claim 1, wherein the plurality of conductive fasteners comprises a plurality of conductive lugs/screws/posts and an associated plurality of nuts.

8. The detachable high powered electronic system of claim 1, wherein some of the plurality of conductive fasteners are configured to deliver a positive supply voltage and a remaining plurality of conductive fasters are configured to return a negative voltage via Ground.

9. The detachable high powered electronic system of claim 1, wherein the power converter module and the heat exchanger assembly are configured to receive a signal connector disposed on the high powered electronic module that connects module electrical components disposed on the high powered electronic module with external electrical components.

10. The detachable high powered electronic system of claim 9, wherein the module electrical components are integrated circuits.

11. A high powered electronic system, comprising:
a plurality of high powered electronic modules;
a heat exchanger assembly;
a plurality of power converter modules, wherein the high powered electronic modules and the power converter modules form a sub-array on the heat exchanger assembly; and
a plurality of mechanical interfaces, each of the mechanical interfaces configured to detachably couple each of the high powered electronic modules and an associated one of the power converter modules via the heat exchanger assembly and further configured to deliver power received from each of the power converter modules to the associated one of the high powered electronic modules, wherein each of the mechanical interfaces comprises a plurality of conductive fasteners for delivering the power to a plurality of electrical components on the high powered electronic modules.

12. The high powered electronic system of claim 11, wherein the power converter modules are power buses or power converters.

13. The high powered electronic system of claim 12, wherein each of the power buses is capable of delivering the power to the mechanical interface.

14. The high powered electronic system of claim 12, wherein each of the power converters is configured to receive a high voltage and a low current and deliver a low voltage and a high current to the mechanical interface, the high voltage is greater than the low voltage and the low current is less than the high current.

15. The high powered electronic system of claim 11, wherein the power is direct current (DC) power.

* * * * *